United States Patent [19]
Kosiec

[11] Patent Number: 5,945,852
[45] Date of Patent: Aug. 31, 1999

[54] CMOS COMPARATOR OUTPUT CIRCUIT WITH HIGH GAIN AND HYSTERESIS

[75] Inventor: Jeannie Han Kosiec, Schaumburg, Ill.

[73] Assignee: Motorola, Inc., Schaumburg, Ill.

[21] Appl. No.: 09/052,467

[22] Filed: Mar. 31, 1998

[51] Int. Cl.[6] .................................. H03K 3/037
[52] U.S. Cl. ............................. 327/68; 327/77; 327/205
[58] Field of Search .............................. 323/315; 327/77, 327/68, 72, 73, 74, 205, 206

[56] References Cited

U.S. PATENT DOCUMENTS

| | | | |
|---|---|---|---|
| 4,394,587 | 7/1983 | McKenzie et al. | 307/355 |
| 4,438,349 | 3/1984 | Shoji | 327/85 |
| 4,553,045 | 11/1985 | Murotani | 327/205 |
| 4,670,671 | 6/1987 | De Weck | 307/355 |
| 5,369,319 | 11/1994 | Good et al. | 327/73 |
| 5,446,396 | 8/1995 | Brehmer | 327/66 |
| 5,514,987 | 5/1996 | Ramirez | 327/74 |
| 5,587,674 | 12/1996 | Danstrom | 327/67 |
| 5,608,344 | 3/1997 | Marlow | 327/206 |
| 5,614,857 | 3/1997 | Lim et al. | 327/205 |
| 5,796,281 | 8/1998 | Saeki et al. | 327/206 |
| 5,880,614 | 3/1999 | Zinke et al. | 327/205 |

FOREIGN PATENT DOCUMENTS 6-85584  3/1994  Japan ............................ H03G 5/16

*Primary Examiner*—Toan Tran
*Attorney, Agent, or Firm*—John G. Rauch; Brian M. Mancini

[57] ABSTRACT

A comparator circuit (100) produces a binary output voltage at an output (109) in response to a time varying input signal received at an input (108). The comparator circuit includes an output circuit (106) having a first current mirror (202), a second current mirror (204), a bias circuit (206) and a helping current source (208). Bias currents are applied in response to the state of the output voltage at the output to increase the gain and the hysteresis of the output circuit.

13 Claims, 1 Drawing Sheet

CMOS COMPARATOR OUTPUT CIRCUIT WITH HIGH GAIN AND HYSTERESIS

FIELD OF THE INVENTION

The present invention generally relates to circuits for providing output signals. More particularly, the present invention relates to a CMOS comparator output circuit offering high gain and hysteresis.

BACKGROUND OF THE INVENTION

In analog circuits fabricated using complementary metal oxide semiconductor (CMOS) techniques, it is common to require a comparator as an output circuit. Such a circuit receives a small signal analog or alternating current (AC) input signal and produces a large digital signal as an output signal. The input signal is compared with a threshold value to produce the output signal. The comparator may be used as an output circuit for interfacing to another integrated circuit, or may provide level conversion. An example of such a circuit is found in automatic gain control (AGC) circuits where detected output power is compared to a known direct current (DC) level and a digital signal is produced to turn on or off an external step attenuator.

Such comparator circuits have a number of operational and performance requirements. The comparator must have hysteresis so that the output signal level will not oscillate between high and low levels due to circuit noise or minute input signal level change. Further, the comparator circuit must have high gain to provide fast output signal transitions. Lastly, the circuit should draw very little current and occupy very little surface area of an integrated circuit.

Accordingly, there is a need in the art for a low power CMOS comparator circuit with high gain and hysteresis.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, and wherein:

DETAILED DESCRIPTION OF A PREFERRED EMBODIMENT

Figure 1:
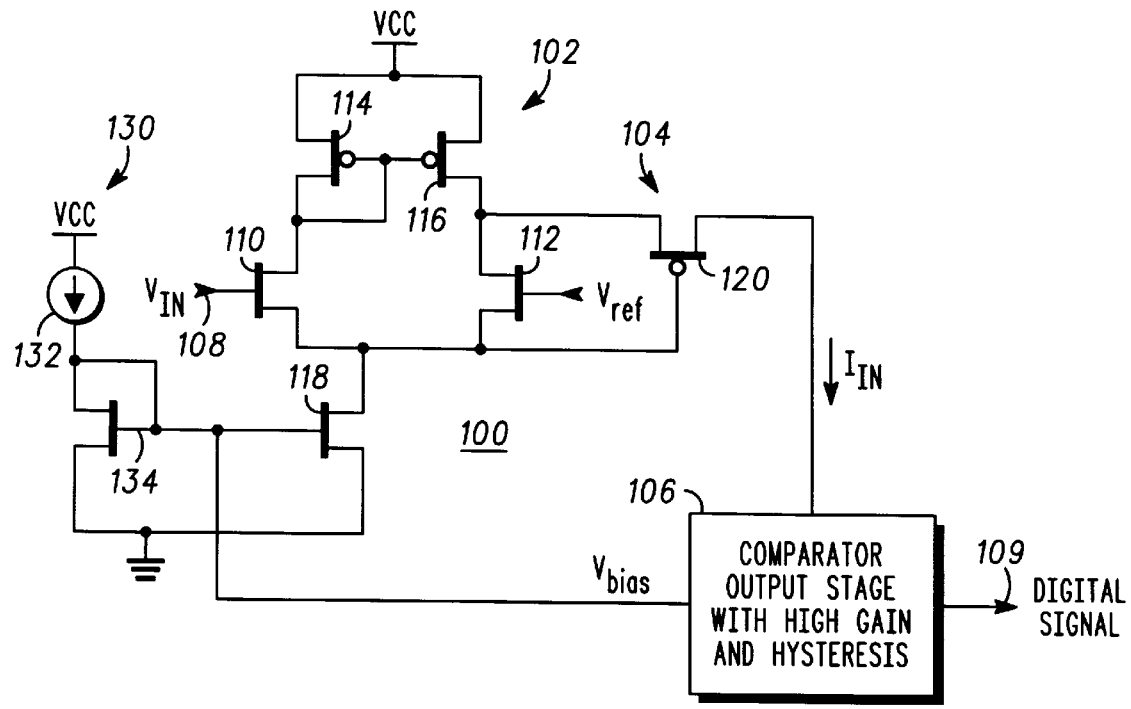
FIG. 1 is a circuit diagram, partially in block diagram form, of a comparator circuit.

Referring now to FIG. 1, a comparator circuit 100 includes a comparing stage 102, a converter 104 and an output circuit 106. The comparing stage receives a time varying input signal at an input 108. The comparing stage 102 produces an intermediate voltage when a time-varying input voltage exceeds a reference voltage. The converter produces a current in response to the intermediate voltage. The output circuit produces a digital or binary output signal at an output 109.

The comparing stage 102 includes a first transistor 110, a second transistor 112, a third transistor 114, a fourth transistor 116 and a fifth transistor 118. The fifth transistor 118 receives a bias potential $V_{bias}$ and generates a substantially constant current at its drain. The source of the fifth transistor 118 is coupled to ground. The fifth transistor 118 thus operates as a current source.

The substantially constant current is steered between first transistor 110 and second transistor 112 in response to the voltages applied at the gates of these transistors. A reference potential $V_{ref}$ is applied to the gate of the second transistor 112. The first transistor 110 receives an input voltage $V_{in}$. In the illustrated embodiment, $V_{in}$ is a small signal, time varying or AC voltage. The reference potential $V_{ref}$ has a DC value that is preferably centered between the maximum and minimum values of the small signal voltage $V_{in}$. As the voltage $V_{in}$ varies about the value of $V_{ref}$, the bias current is steered between the first transistor 110 and the second transistor 112.

The third transistor 114 and the fourth transistor 116 act as load devices. The third transistor 114 and fourth transistor 116 are configured as a current mirror load. When the bias current is steered through the second transistor 112 and through the fourth transistor 116, a potential difference is created across the fourth transistor 116 and a portion of the current in the fourth transistor 116 is steered through the second transistor 112. The potential difference may be considered an intermediate signal. When the bias current is steered through the first transistor 110 and through the third transistor 114, the potential difference across the fourth transistor 116 is reduced and less of the current in the fourth transistor 116 is steered to the second transistor 112.

Current in the fourth transistor 116 which is not steered through the second transistor 112 is steered to the converter 104. The converter 104 includes a cascode connected transistor 120. The converter 104 detects the intermediate signal at the fourth transistor 116 and produces a current in response. This current is the input current $I_{in}$ to the output circuit 106. The gate of the transistor 120 is coupled to the sources of the first transistor 110 and the second transistor 112. The source of the transistor 120 is coupled to the drain of the fourth transistor 116 and the drain of the second transistor 112. The source of the transistor 120 is coupled to the output circuit 106 and provides the current $I_{in}$. The output circuit will be described below in conjunction with FIG. 2.

To complete the identification of elements in FIG. 1, the comparator circuit 100 includes a bias generator 130. The bias generator 130 includes a current source 132, and a transistor 134. The current source 132 generates a substantially constant current. The transistor 134 is mirror connected with the fifth transistor 118. By mirror connected, it is meant that the two transistors have a common gate and common source so that they will conduct currents having a magnitude set by the relative sizes of the transistors. The common gate of these transistors is at the voltage $V_{bias}$. This voltage is supplied to the output circuit 106.

Figure 2:
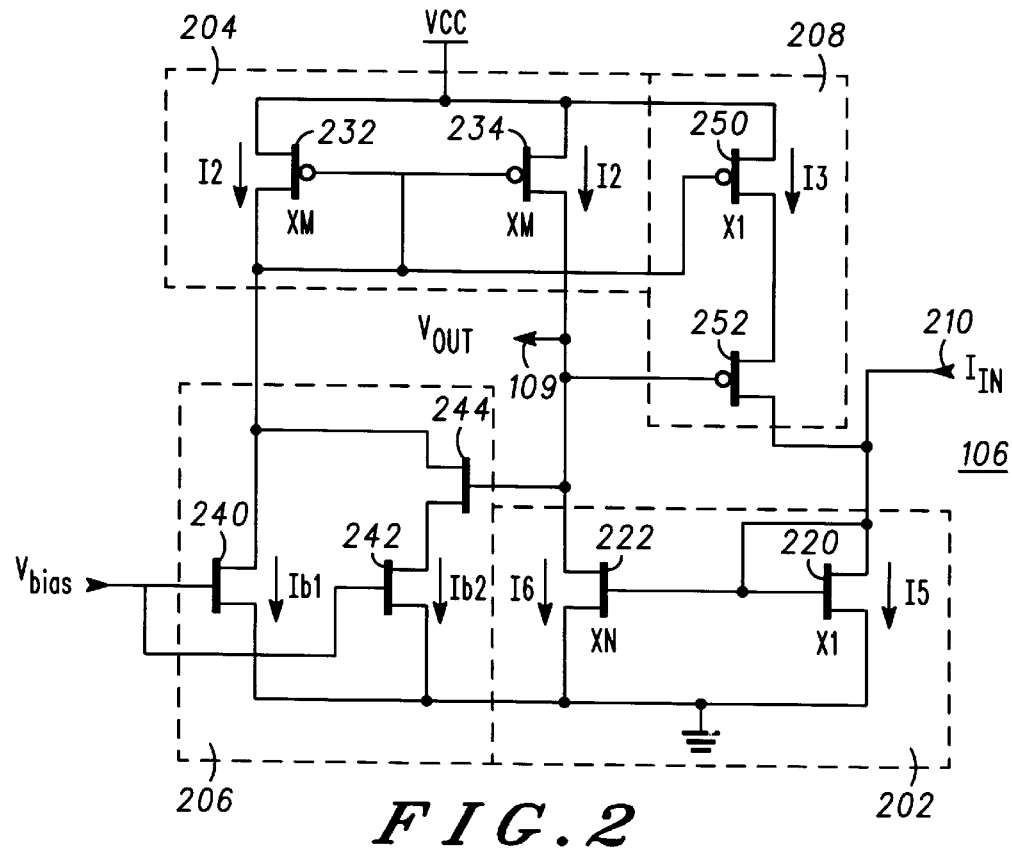
FIG. 2 is a circuit diagram of an output circuit which may be used in conjunction with the comparator circuit of FIG. 1.

Referring now to FIG. 2, the output circuit 106 includes a first current mirror 202, a second current mirror 204, a bias circuit 206 and a helping current source 208. The output circuit 106 receives an input current $I_{in}$ at an input 210 and provides a binary output voltage at an output 109.

The first current mirror 202 includes a first transistor 220 and a second transistor 222. The first transistor 220 and the second transistor 222 are mirror connected. The common gate of the two transistors is short circuited to the drain of the first transistor 220. The drain of the first transistor 220 is coupled to the input 210 and receives the input current $I_{in}$. The first transistor 220 thus forms an input circuit configured to receive an input current, $I_{in}$. The current conducted in the first transistor is labeled $I_5$ in FIG. 2. The first current mirror 202 thus is configured to receive the input current $I_{in}$ and produce a first polarity current, $I_6$.

The first transistor 220 and second transistor 222 are sized to provide current gain. Preferably, the second transistor 222 has an aspect ratio that is N times the aspect ratio of the first transistor 220. The aspect ratio is the ratio of transistor width to length and is directly proportional to transistor current. In one example, N is 2. The current in the second transistor 222 is labeled $I_6$ in FIG. 2. Thus, $I_6=NI_5=2I_5$. The drain of the second transistor 222 is coupled to the output 109. The first current mirror 202 thus is configured to receive the input current $I_{in}$ and produce a first polarity current, $I_6$.

The second current mirror 204 includes a first transistor 232 and a second transistor 234. These two transistors are mirror connected and the common gate is short circuited to the drain of the first transistor 232. The current in the first transistor 232 is labeled 12 in FIG. 2. Preferably, the first transistor 232 and the second transistor 234 are sized substantially identically so that the current in the second transistor 234 is substantially identical to the current in the first transistor 232. The current in the second transistor 234 is accordingly labeled $I_2$ in FIG. 2. The drain of the second transistor 234 is coupled to the output 109. The second current mirror 204 thus is configured to receive a bias current, $I_2$ from the bias circuit 206, and produce a second polarity current, $I_2$ provided to the output 109. The first current mirror 202 and the second current mirror 204 each have a transistor series coupled with the output 109 to produce a binary output voltage. The current commonly conducted in the first current mirror 202 (labeled $I_2$ in FIG. 2) and the second current mirror 204 (labelled $I_6$ in FIG. 2) is referred to herein as an internal current.

The bias circuit 206 includes a first transistor 240, a second transistor 242 and a third transistor 244. The first transistor 240 has a drain coupled to the second current mirror 204 and a gate coupled to the bias potential $V_{bias}$. In response to the bias potential, the first transistor 240 provides a substantially constant current and thus forms a bias current source. The current in the first transistor 240 is labelled $I_{b1}$ in FIG. 2. The second transistor 242 similarly has a gate coupled to the bias potential $V_{bias}$ and in response provides a substantially constant current. The current in the second transistor 242 is labelled $I_{b2}$ in FIG. 2. The third transistor 244 is disposed between the drain of the second transistor 242 and the second current mirror 204. The third transistor operates as a switch to switch in the second transistor 242. The second transistor 242 thus forms a switchable current source and the third transistor 244 forms a switch coupled between the switchable current source and the second current mirror for switching the switchable current source when the binary output voltage has a predetermined level. In the illustrated embodiment, the switch comprises a single field effect transistor having a gate electrically coupled to the output 109. However, any suitable switching device or circuit, such as a CMOS transfer gate or a combination of bipolar transistors or diodes, could be substituted for the third transistor 244.

The helping current source 208 includes a first transistor 250 and a second transistor 252. The first transistor 250 is mirror connected with the first transistor 232 and the second transistor 234 of the second current mirror 204. Preferably, the transistor 250 and the first transistor 232 and the second transistor 234 of the second current mirror 204 are sized so that the first transistor 232 and the second transistor 234 of the second current mirror 204 are M times larger than the current in the transistor 250. In one example, M is set to 4.

The current in the transistor 250 is labelled $I_3$ in FIG. 2. The second transistor 252 of the helping current source 208 is connected as a switch. The second transistor 252 has a gate coupled to the output 109 and a drain coupled to the first current mirror 202. In response to the potential $V_{out}$ at the output 109, the switch opens or closes to couple the first transistor 250 to the first current mirror 202 to provide a helping current during logic state transition. Any suitable switching device or circuit could be substituted for the transistor 252.

It can be shown that, for proper operation, M must be greater than N. For $V_{out}$ to be at a logic 0, $I_2=I_{2l}$, meaning $I_3=I_{2l}/M$. Also, $$I_5 = I_{IN} + I_3 = I_{IN} + \frac{I_{2l}}{M}$$

and $$I_6 I_5 \times NI_{IN} + \left(\frac{I_{2l}}{M}\right)N.$$

For $V_{out}$ to stay low, $I_6>I_2$, meaning $$NI_{IN} + \left(\frac{I_{2l}}{M}\right)N > I_2 = I_{2l}$$

$$NI_{IN} + \left(\frac{I_{2l}N}{M}\right) > I_{2l}$$

$$NI_{IN} > I_{2l}\left(1 - \frac{N}{M}\right)$$

For $V_{out}$ to switch from low to high, $$NI_{IN} < I_{2l}\left(1 - \frac{N}{M}\right)$$

Rearranging, $$I_{IN} < I_{2l}\left(\frac{1}{N} - \frac{1}{M}\right)$$

Since Iin must be greater than or equal to zero, for this inequality to be true, M>N.

The output circuit 106 operates as follows, assuming M=4 and N=2. Initially, the voltage at the output 109, $V_{out}$, is at the voltage corresponding to a logic 1. Then $I_2=I_{b1}+I_{b2}$. To change $V_{out}$ to a logic 0 state, $I_6$ must be greater than $I_2$. With $V_{out}$ a logic 1 state, the transistor 250 of the helping current source is turned off and the switch formed by this transistor is open. Since the switch is open, $I_5$ is equal to only $I_{in}$. According to the device size ratio between transistor 220 and transistor 222, to switch the state of $V_{out}$, $I_{in}$ must be greater than one-half of $I_2$. Therefore, the initial $V_{out}$ transition from 1 to 0 will occur when $I_{in}$ is greater than $(I_{b1}+I_{b2})/2$.

Once $V_{out}$ transitions from 1 to 0, the switch formed by transistor 250 starts to close. As the logic state changes, the gate to source voltage of transistor 250 increases above the threshold of the transistor and the transistor 250 begins to conduct current. This current, $I_3$ adds to $I_{in}$ to form $I_5$. This additional helping current from the helping current source 208 increases gain and adds hysteresis to the output circuit 106. As $I_{in}$ is increased, $I_6$ is increased and the increase is multiplied by N, the ratio of device sizes for transistor 220 and transistor 222. The increase in $I_6$ helps to pull the output 109 to logic 0 faster.

In accordance with the present invention, further gain and hysteresis is provided by splitting the current $I_2$ from the transistor 232 of the second current mirror 204 into a constant bias current $I_{b1}$ and a switchable bias current $I_{b2}$. The switchable current is controlled by the switch formed by transistor 244 of the bias circuit 206. In this manner, the bias circuit 206 forms a bias current source coupled to the second current mirror 204 to produce a bias current at one of a first magnitude ($I_{b1}$) and a second magnitude ($I_{b1}+I_{b2}$).

During the $V_{out}$ transition from 1 to 0, transistor 244 starts opening. When $V_{out}$ has a logic 1 value, the gate to source voltage of transistor 244 exceeds the threshold voltage of the transistor and transistor 244 conducts current $I_{b2}$. As the gate to source voltage decreases, transistor 244 stops conducting and the switch formed by this transistor opens. As the switch opens, $I_2$ at the drain of transistor 232 of the second current mirror 204 is reduced from ($I_{b1}+I_{b2}$) to $I_{b1}$ only. Since $I_2$ at transistor 232 is mirrored as $I_2$ at transistor 234 of the second current mirror, $I_2$ at transistor 234 is similarly reduced. Thus $I_2$ at transistor 234 which tends to keep $V_{out}$ at the logic 1 state is reduced, gain is increased and $V_{out}$ transitions at a faster rate. The helping current $I_3$ also decreases as $I_2$ decreases, since transistor 250 is mirror connected with transistor 232. However, the helping current $I_3$ has a maximum value when $V_{out}$ is around mid-supply, which is when the helping current is most needed in pulling down the voltage $V_{out}$ at the output 109.

For transition of $V_{out}$ from logic state 0 to logic state 1, $I_6$ must be less than $I_2$. In this case, because $V_{out}$ is at 0, the switch formed by transistor 244 is open and the transistor 244 is not conducting. Thus, $I_2$ is initially $I_{b1}$. For $I_6$ to be less than $I_{b1}$, $I_5$ must be less than $I_{b1}/N$, where N=2 in the present example. In this case, $I_5=I_3+I_{in}$ and $I_3=I_2/M$, by operation of the second current mirror, with M set to 4 in this example. Thus, $I_{in}$ must be less than $I_{b1}/4$ before $V_{out}$ transitions from 0 to 1.

As $I_{in}$ decreases below this threshold value, $I_6$ also decreases. The decrease in $I_{in}$ is multiplied at $I_6$ by N, the ratio of sizes of transistor 220 and transistor 222. As $I_6$ decreases, $V_{out}$ begins to increase. As $V_{out}$ increases, the switch formed by transistor 244 begins to close as transistor 244 begins to conduct current $I_{b2}$. With transistor 244 conducting, $I_2$ is equal to ($I_{b1}+I_{b2}$) This increase in $I_2$ provides gain and speeds the transition of $V_{out}$ from logic 0 to logic 1. As $V_{out}$ transitions from 0 to 1, the switch formed by transistor 252 is initially closed and the helping current is combined with $I_{in}$. However, as $V_{out}$ nears logic 1, transistor 252 is stops conducting and the switch is opened, again speeding the transition of $V_{out}$ all the way to the logic 1 state.

Hysteresis of the output circuit 106 is determined by the $I_{in}$ current levels necessary to toggle the output. As noted above, initial $V_{out}$ transition from 1 to 0 occurs when $I_{in}$ is greater than ($I_{b1}+I_{b2}$)/2. Similarly, initial $V_{out}$ transition from 0 to 1 occurs when $I_{in}$ is less than $I_{b1}/4$. Thus, the hysteresis is the difference between ($I_{b1}+I_{b2}$)/2 and $I_{b1}/4$. The hysteresis can be adjusted by varying the values of N and M and by varying the bias current $I_{b1}$ and the switchable current $I_{b2}$. Thus, the first current mirror 202 and the second current mirror 204 together form a comparing circuit which establishes an output voltage at a first value when the input current $I_{in}$ exceeds a first predetermined threshold and at a second value when the input current exceeds a second predetermined value. The bias circuit 206 varies the bias current in response to the output voltage to establish hysteresis.

As can be seen from the foregoing, the present invention provides a low power CMOS comparator circuit. A small signal voltage is compared with a threshold level to generate an intermediate voltage. The intermediate voltage is converted to a current which is used to control an output circuit. In the output circuit, bias currents are adjusted before, during and after the output voltage transitions between logic states. These bias current adjustments increase the gain and the hysteresis of the circuit.

While a particular embodiment of the present invention has been shown and described, modifications may be made. It is therefore intended in the appended claims to cover all such changes and modifications which fall within the true spirit and scope of the invention.

What is claimed is:

1. A circuit which produces a binary output voltage at an output in response to a time varying input signal, the circuit comprising:

a first current mirror having a transistor that is series coupled with the output and produces a first current at the output in response to the input signal;

a second current mirror having a transistor that is series coupled with the output and produces a second current at the output in response to a bias current, the first and the second currents producing the binary output voltage having a state determined by relative magnitudes of the first current and the second current; and a bias circuit including a bias current source, a switchable current source, and a switch coupled between the switchable current source and the second current mirror for switching the switchable current source so as to provide the bias current at one of a first value and a second value in response to the state of the binary output voltage.

2. The circuit of claim 1 wherein the switch comprises a field effect transistor having a gate electrically coupled to the output.

3. The circuit of claim 1 further comprising:

a helping current source which generates a helping current; and a switch for combining the helping current and the input signal at the first current mirror in response to the state of the binary output voltage, the first current increasing in response to the helping current.

4. The circuit of claim 3 wherein the switch comprises a field effect transistor having a gate electrically coupled to the output, a source coupled to the helping current source and a drain coupled to an input which receives an input current as the input signal, the field effect transistor providing the helping current to the input when the binary output voltage has a predetermined level.

5. The circuit of claim 3 wherein helping current source is mirror-connected with the second current mirror.

6. A circuit which produces a binary output voltage in response to an input current, the circuit comprising:

a first current mirror configured to receive the input current and produce a first polarity current;

a second current mirror configured to receive a bias current and produce a second polarity current, the first current mirror and the second current mirror each having a transistor series coupled with an output of the circuit to produce the binary output voltage; and a bias circuit coupled to the second current mirror and producing the bias current at one of a first magnitude and a second magnitude responsive to state of the binary output voltage, the bias circuit including a bias current source which produces a first portion of the bias current, a switchable current source which produces a second portion of the bias current, and a switch to switch in the switchable current source when the binary output voltage has a predetermined level so as to combine the first and second portions of the bias current.

7. The circuit of claim 6 further comprising:

a comparing stage which compares a time varying input voltage and a reference voltage and produces an intermediate voltage in response thereto; and a converter coupled to the first current mirror which produces the input current in response to the intermediate voltage.

8. A comparator comprising:

an input stage which compares a time varying input voltage and a reference voltage and produces an intermediate voltage in response to the comparison;

a converter coupled to the input stage which produces an input current in response to the intermediate voltage;

an input circuit coupled to the converter and configured to receive the input current;

a comparing circuit coupled to the input circuit, the comparing circuit establishes an output voltage at a first value when the input current exceeds a first predetermined threshold of a bias current and at a second value when the input current exceeds a second predetermined threshold of the bias current; and a bias circuit coupled to the comparing circuit, the bias circuit varies the bias current in response to the output voltage to establish hysteresis in the comparator.

9. The comparator of claim 8 wherein the comparing circuit comprises series coupled transistors each conducting an internal current, the output voltage produced at a node common to the series coupled transistors in response to magnitude of the internal current.

10. The comparator of claim 9 wherein the bias circuit comprises:

a first current source coupled to the comparing circuit and providing a first bias current; and a switchable current source coupled to the comparing circuit and providing a switchable current, the comparing circuit combining the first bias current and the switchable current for comparison with the input current.

11. The comparator of claim 10 wherein the comparing circuit comprises:

a first current mirror which produces the internal current in response to the input current; and a second current mirror which produces the internal current in response to combination of the first bias current and the switchable current.

12. The comparator of claim 10 wherein the switchable current source switches in response to the output voltage.

13. The comparator of claim 8 further comprising:

a helping current source which generates a helping current; and a switch for combining the helping current and the input current in response to state of the output voltage.

* * * * *